(12) United States Patent
Eom

(10) Patent No.: US 9,263,462 B2
(45) Date of Patent: Feb. 16, 2016

(54) SEMICONDUCTOR DEVICE

(71) Applicant: SK hynix Inc., Icheon-si Gyeonggi-do (KR)

(72) Inventor: Dae Sung Eom, Cheongju-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/560,638

(22) Filed: Dec. 4, 2014

(65) Prior Publication Data

US 2016/0013203 A1 Jan. 14, 2016

(30) Foreign Application Priority Data

Jul. 14, 2014 (KR) ........................ 10-2014-0088557

(51) Int. Cl.
*H01L 29/792* (2006.01)
*H01L 27/115* (2006.01)
*H01L 29/10* (2006.01)
*H01L 23/528* (2006.01)
*H01L 21/00* (2006.01)

(52) U.S. Cl.
CPC ........ *H01L 27/11582* (2013.01); *H01L 23/528* (2013.01); *H01L 27/11565* (2013.01); *H01L 29/1037* (2013.01); *H01L 29/7926* (2013.01)

(58) Field of Classification Search
None
See application file for complete search history.

(56) References Cited

U.S. PATENT DOCUMENTS

| 6,809,958 | B2 * | 10/2004 | Bloomquist | ............ | G11C 11/15 365/158 |
|---|---|---|---|---|---|
| 2007/0272973 | A1 * | 11/2007 | Park | ........................ | B82Y 10/00 257/324 |
| 2010/0133606 | A1 * | 6/2010 | Jang | .................. | H01L 27/11551 257/329 |
| 2010/0320528 | A1 * | 12/2010 | Jeong | .................... | H01L 27/105 257/324 |
| 2011/0193153 | A1 * | 8/2011 | Higuchi | ............ | H01L 27/11578 257/324 |
| 2011/0298013 | A1 * | 12/2011 | Hwang | ............. | H01L 27/11551 257/208 |
| 2011/0310670 | A1 * | 12/2011 | Shim | .................. | G11C 16/0408 365/185.17 |
| 2013/0207225 | A1 * | 8/2013 | Sakui | .................. | H01L 29/7889 257/499 |
| 2013/0270631 | A1 * | 10/2013 | Kim | ..................... | H01L 29/7827 257/331 |
| 2014/0063890 | A1 * | 3/2014 | Lee | ................... | H01L 27/11519 365/63 |
| 2014/0191306 | A1 * | 7/2014 | Hopkins | ............. | H01L 29/7889 257/315 |
| 2014/0326939 | A1 * | 11/2014 | Yamato | ............... | H01L 45/1616 257/2 |
| 2015/0001460 | A1 * | 1/2015 | Kim | .................. | H01L 27/11578 257/5 |

FOREIGN PATENT DOCUMENTS

KR 1020140020139 A 2/2014
KR 1020140137632 A 12/2014

* cited by examiner

*Primary Examiner* — Evren Seven
(74) *Attorney, Agent, or Firm* — William Park & Associates Ltd.

(57) ABSTRACT

A semiconductor device may include a first insulating pillar having a substantially Y-shaped cross-sectional structure to define first through third regions, channel pillars formed in the first through third regions, respectively, and second insulating pillars disposed opposite one another across the first through third regions. The semiconductor device may also include third insulating pillars disposed between the second insulating pillars and disposed opposite one another across the first through third regions. The third insulating pillars may extend in a direction intersecting the second insulating pillars.

20 Claims, 11 Drawing Sheets

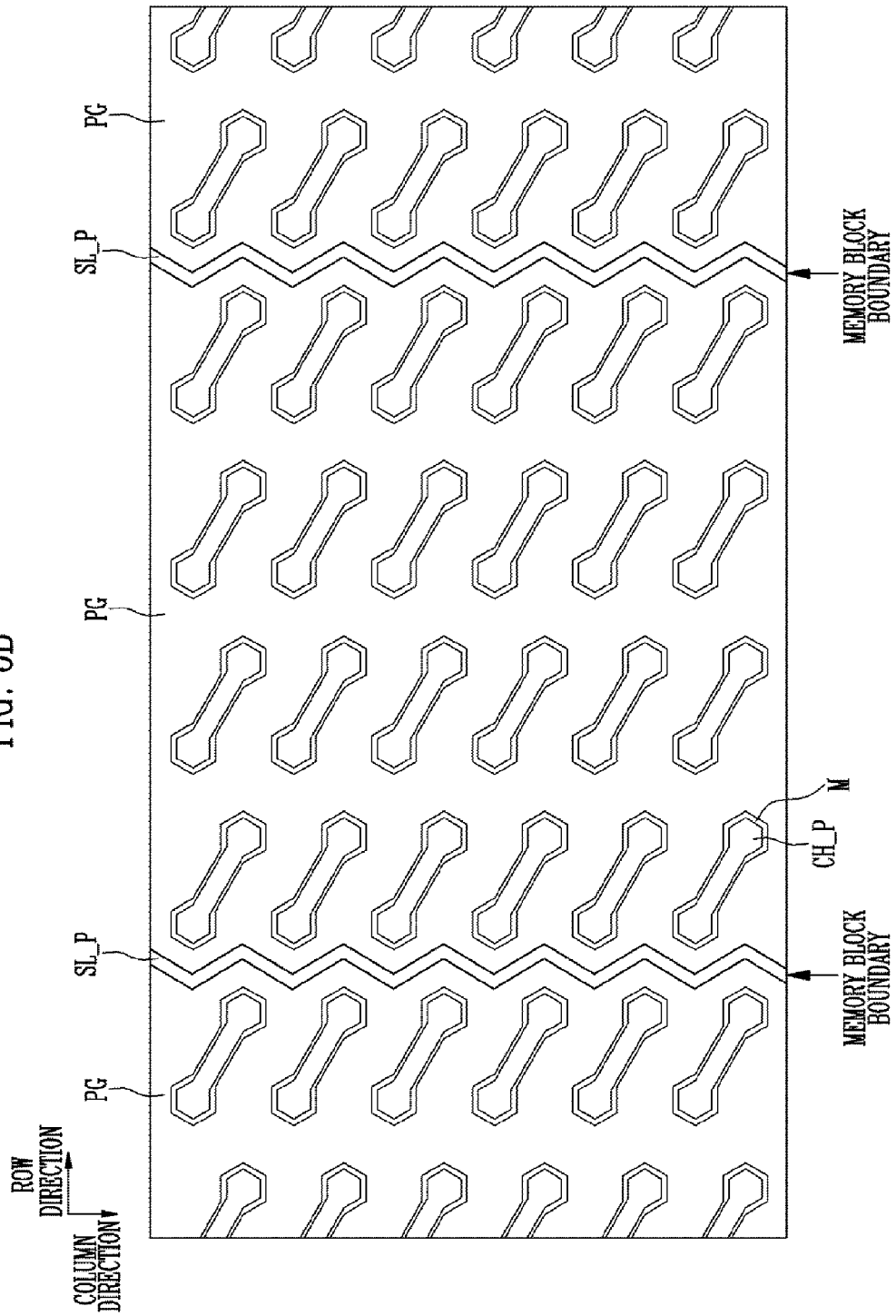

SEMICONDUCTOR DEVICE

CROSS-REFERENCE TO RELATED APPLICATION

The present application claims priority to Korean patent application number 10-2014-0088557 filed on Jul. 14, 2014, in the Korean Intellectual Property Office, the entire disclosure of which is incorporated by reference herein.

BACKGROUND

1. Technical Field

Various embodiments relate generally to semiconductor devices, and more particularly, to a three-dimensional (3D) memory devices.

2. Related Art

A semiconductor device includes a memory device capable of storing data. The memory device includes memory cells. A three-dimensional (3D) memory device includes memory cells stacked at a plurality of layers on a substrate. Thus, the 3D memory device is more advantageous for high integration than a two-dimensional memory device including memory cells disposed at a single layer on a substrate.

To increase the integration density of a 3D memory device, the number of memory cells stacked on a substrate may be increased. As the stacked number of the memory cells increases, however, the stack structure of the memory cells becomes more susceptible to collapsing. As a result, the reliability of the process associated with the manufacturing a 3D memory device may be degraded. This degradation may be due to the stability issues associated with the stacked structure.

A 3D memory device includes a conductive pattern surrounding a channel pillar. As the thickness of the conductive pattern surrounding the channel pillar becomes increases in uniformity, operating reliability of the 3D memory device further improves. However, there may be a reduction in the reliability of a 3D memory device's operations because of the difficulties associated with forming a conductive pattern, surrounding the channel pillar, with a uniform thickness.

BRIEF SUMMARY

An embodiment may provide a semiconductor device including a first insulating pillar having a substantially Y-shaped cross-sectional structure to define first through third regions, and channel pillars formed in the first through third regions, respectively. The semiconductor device may also include second insulating pillars disposed opposite one another across the first through third regions, and third insulating pillars disposed between the second insulating pillars and disposed opposite one another across the first through third regions. The third insulating pillars may extend in a direction intersecting the second insulating pillars.

An embodiment may provide a semiconductor device including first insulating pillars substantially arranged as a matrix in a row direction and a column direction, and each first insulating pillar may have a substantially Y-shaped cross-sectional structure. The semiconductor device may also include second insulating pillars disposed across each column of the first insulating pillars, the second insulating pillars extending along the column direction, and third insulating pillars extending along the row direction between the second insulating pillars, the third insulating pillars disposed across any one of the first insulating pillars. The semiconductor device may include channel pillars formed in regions defined by the first through third insulating pillars, and pipe channels, each pipe channel configured to connect a pair of adjacent channel pillars across any one of the second insulating pillars.

An embodiment may provide a semiconductor device including a first insulating pillar having n branches radially extending from the center thereof, the first insulating pillar defining first through n-th regions divided from one another by the n branches, wherein n is an integer equal to or larger than 2. The semiconductor device may also include channel pillars formed in the first through n-th regions, respectively, and second insulating pillars disposed opposite each other across the first through n-th regions, the second insulating pillars extending in a first direction. The semiconductor device may include third insulating pillars disposed between the second insulating pillars, the third insulating pillars extending in a second direction intersecting the first direction.

BRIEF DESCRIPTION OF THE DRAWINGS

FIGS. 5A and 5B are representations of diagrams for describing a structure of a semiconductor device according to an embodiment.

DETAILED DESCRIPTION

Various embodiments will be described more fully hereinafter with reference to the accompanying drawings, in which examples of embodiments are illustrated. These embodiments, however, may be embodied in different forms and should not be construed as limited to the embodiments set forth herein. Rather, these embodiments are provided so that this disclosure is thorough and complete and fully conveys the scope of the description to one skilled in the art.

Various embodiments may be directed to a semiconductor device, which may improve stability and reliability during a manufacturing process and operating of a three-dimensional (3D) memory device.

Figure 1:
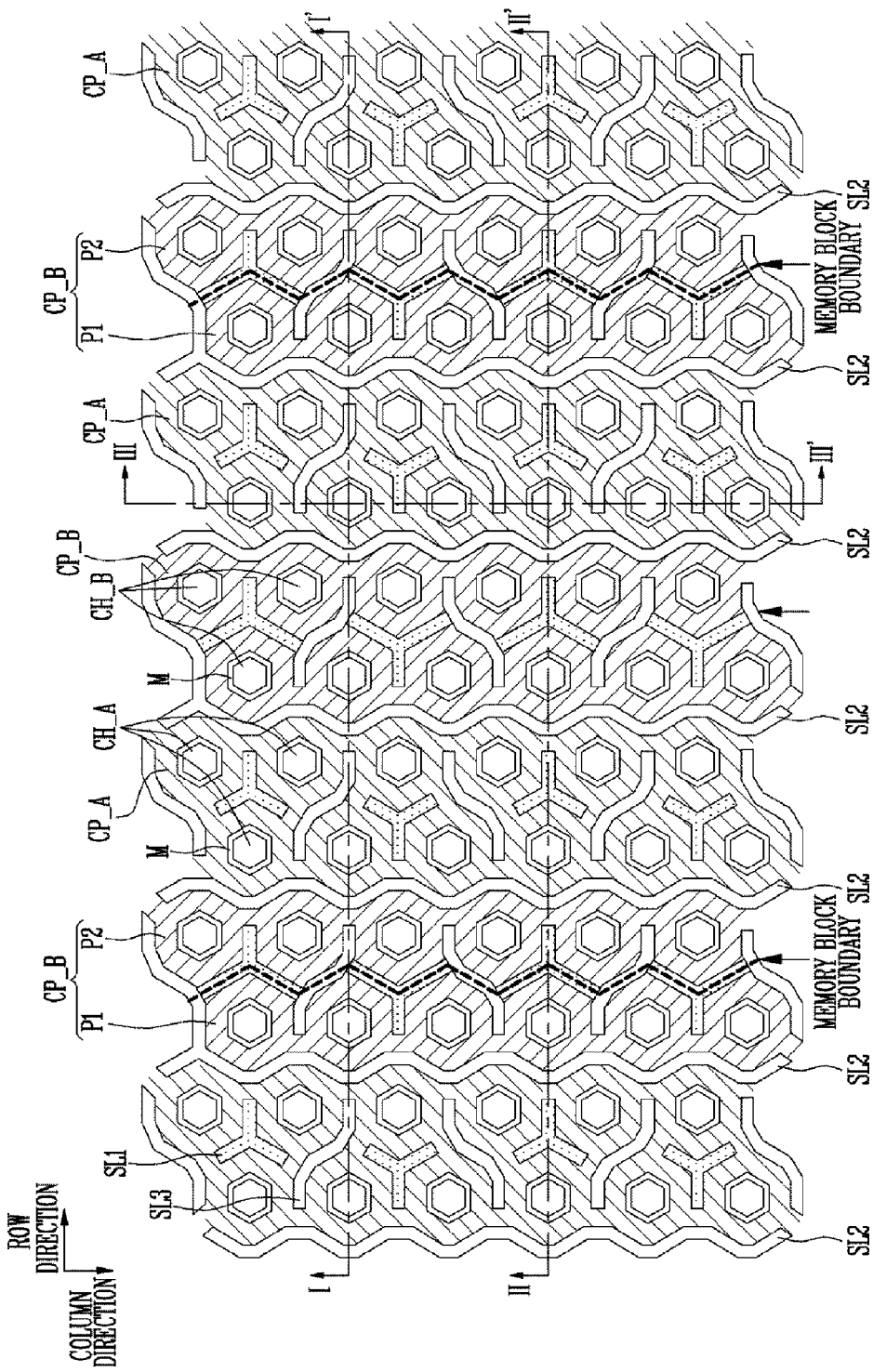
FIG. 1 is a plan view of a representation of a semiconductor device according an embodiment.

FIG. 1 is a plan view of a representation of a semiconductor device according to an example of an embodiment. In particular, FIG. 1 is a plan view of a cross-section of a layer at which a conductive pattern is formed.

Referring to FIG. 1, the semiconductor device according to an embodiment may include channel pillars CH_A and CH_B, conductive patterns CP_A and CP_B surrounding the channel pillars CH_A and CH_B with a uniform thickness. The semiconductor device may also include first through third insulating pillars SL1 to SL3 configured to define regions where the channel pillars CH_A and CH_B and the conductive patterns CP_A and CP_B will be formed.

The first insulating pillars SL1 may be arranged as a matrix in a row direction and a column direction intersecting the row direction. Each of the first insulating pillars SL1 may include a first protrusion, a second protrusion, and a third protrusion. Each protrusion may have a Y-shaped cross-section or substantially a Y-shaped cross-section. The first through third protrusions may be unfolded at the same angle. Namely, the angles defined between the first and second protrusions, between the second and third protrusions and between the third and first protrusions may be substantially the same. Since the Y-shaped first insulating pillars SL1 may have structurally high supporting power, the Y-shaped first insulating pillars SL1 may stably support a stack structure obtained by alternately stacking first and second material layers. As a result, the Y-shaped first insulating pillars SL1 may reduce the possible collapse of the stack structure. The first insulating pillars SL1 may be spaced apart from the second insulating pillars SL2.

The second insulating pillars SL2 may be disposed across any one column formed by the first insulating pillars SL1. The second insulating pillars SL2 may extend along the column direction or substantially along the column direction. The second insulating pillars SL2 may be spaced apart from the third insulating pillars SL3.

The third insulating pillars SL3 may be disposed between the second insulating pillars SL2 and extend along the row direction or substantially along the row direction. The third insulating pillars SL3 may be disposed across any one of the first insulating pillars SL1. A pair of third insulating pillars SL3 may face each other across one first insulating pillar SL1. The third insulating pillars SL3 may be connected to the first insulating pillars SL1 or spaced apart from the first insulating pillars SL1. More specifically, first insulating pillars SL1 formed at a memory block boundary between memory blocks may be connected to the third insulating pillars SL3, while the remaining first insulating pillars SL1 may be spaced apart from the third insulating pillars SL3.

The first protrusion of each of the first insulating pillars SL1 may face any one of a pair of second insulating pillars SL2 disposed at both sides of the first protrusion, and be spaced apart from the second insulating pillars SL2. The second and third protrusions of each of the first insulating pillars SL1 may face third insulating pillars SL3 disposed at both sides of the second and third protrusions. The second and third protrusions of the first insulating pillars SL1 may extend and connect with the third insulating pillars SL3 disposed adjacent thereto.

Each of the first through third insulating pillars SL1 to SL3 may be bent along outer circumferences of the channel pillars CH_A and CH_B. The first through third insulating pillars SL1 to SL3 may be bent to define spaces having hexagonal cross-sectional structures or substantially hexagonal cross-sectional structures.

The channel pillars CH_A and CH_B may be formed in regions defined by the first through third insulating pillars SL1 to SL3. A cross-section of each of the channel pillars CH_A and CH_B may have one of various shapes, such as a circular shape or substantially a circular shape, an elliptical shape or substantially an elliptical shape, and a polygonal shape or substantially a polygonal shape. The cross-section of each of the channel pillars CH_A and CH_B may have a hexagonal shape or substantially a hexagonal shape. In these cases, the density of disposition of the channel pillars CH_A and CH_B may be maximized. The channel pillars CH_A and CH_B may include first channel pillars CH_A and second channel pillars CH_B. The first channel pillars CH_A and the second channel pillars CH_B may be alternately disposed in regions isolated from one another by the second insulating pillars SL2.

The conductive patterns CP_A and CP_B may be formed in conductive pattern regions, which may be regions opened by the first through third insulating pillars SL1 to SL3 and the channel pillars CH_A and CH_B. The conductive patterns CP_A and CP_B may surround the channel pillars CH_A and CH_B or substantially surround the channel pillars CH_A and CH_B. The conductive patterns CP_A and CP_B may be formed in hexagonal spaces defined by the first through third insulating pillars SL1 to SL3 to surround or substantially surround the hexagonal channel pillars CH_A and CH_B. Thus, a cross-section of each of the conductive patterns CP_A and CP_B may have a honeycomb structure filled with the channel pillars CP_A and CP_B or may have substantially a honeycomb structure filled with the channel pillars CP_A and CP_B. The conductive patterns CP_A and CP_B having the honeycomb structure may surround the channel pillars CH_A and CH_B to a uniform thickness or substantially a uniform thickness.

The conductive patterns CP_A and CP_B may include first conductive patterns CP_A and second conductive patterns CP_B. The first conductive patterns CP_A and the second conductive patterns CP_B may be alternately disposed in the regions isolated from one another by the second insulating pillars SL2. Each of the first conductive patterns CP_A may be formed in a unified pattern surrounding the first channel pillars CH_A and the first insulating pillars SL1 disposed between a pair of adjacent second insulating pillars SL2. Each of the second conductive patterns CP_B may surround the second channel pillars CH_B disposed between a pair of adjacent second insulating pillars SL2. Each of the second conductive patterns CP_B may be formed in a unified pattern or be separated into a first pattern P1 and a second pattern P2 between the pair of adjacent second insulating pillars SL2. More specifically, the second conductive pattern CP_B formed at the memory block boundary may be separated into the first pattern P1 and the second pattern P2, while each of the remaining second conductive patterns CP_B is formed in a unified pattern surrounding the first insulating pillars SL1. The first pattern P1 and the second pattern P2 may be separated from each other by the first insulating pillars SL1 and the third insulating pillars SL3 that are connected to each other.

A multilayered layer M may be further formed between the conductive patterns CP_A and CP_B and the channel pillars CH_A and CH_B. The multilayered layer M may include at least one of a tunnel insulating layer, a data storage layer, and a blocking insulating layer. The tunnel insulating layer may be in contact with the channel pillars CH_A and CH_B, the data storage layer may be in contact with the tunnel insulating layer, and the blocking insulating layer may be in contact with the data storage layer. The tunnel insulating layer may include a silicon oxide layer, and the data storage layer may be formed of a material capable of trapping charges. For example but not limited to, the data storage layer may be formed of a silicon nitride layer. The blocking insulating layer may include at least one of a silicon oxide layer and a high-k dielectric layer having a higher dielectric constant than the silicon oxide layer.

Figure 2A:
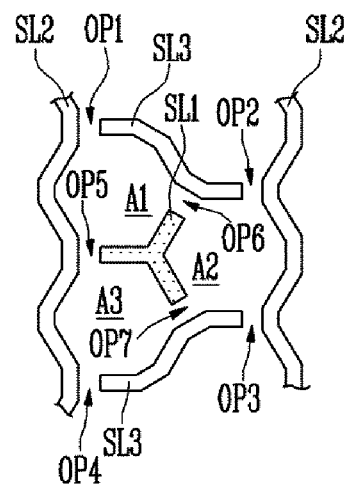
FIGS. 2A and 2B are plan view representations of regions defined by first through third insulating pillars of the semiconductor device of FIG. 1, according an embodiment.
Figure 2B:
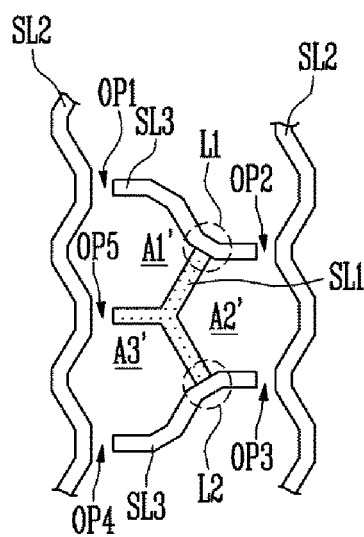

FIGS. 2A and 2B are plan view representations of regions defined by the first through third insulating pillars SL1 to SL3 of the semiconductor device of FIG. 1 according to an embodiment.

Referring to FIGS. 2A and 2B, first through third regions A1 to A3 or A1' to A3' may be defined by the Y-shaped first insulating pillar SL1. The second insulating pillars SL2 may face each other across the first through third regions A1 to A3 or A1' to A3'. The third insulating pillars SL3 may face each other across the first through third regions A1 to A3 or A1' to A3' between the second insulating pillars SL2. The third insulating pillars SL3 may extend in a direction intersecting the second insulating pillars SL2.

Each of the first through third regions A1 to A3 or A1' to A3' may have a hexagonal cross-sectional structure or substantially hexagonal cross-sectional structure due to the Y-shaped first insulating pillar SL1 and the bent second and third insulating pillars SL2 and SL3. The channel pillars CH_A and CH_B, which are described above with reference to FIG. 1, may be respectively formed in the first through third regions A1 to A3 or A1' to A3'.

The second insulating pillars SL2 may be spaced apart from the third insulating pillars SL3. Thus, first through fourth openings OP1 to OP4 serving as a conductive pattern region may be formed between the second and third insulating pillars SL2 and SL3 disposed adjacent to one first insulating pillar SL1. To uniformize (or create uniformity of) the thickness of a conductive pattern, the first through fourth openings OP1 to OP4 may be formed to have the same width or substantially the same width.

The second insulating pillars SL2 may be spaced apart from the first insulating pillar SL1. Thus, a fifth opening OP5 serving as a conductive pattern region may be formed between one of the second insulating pillars SL2 and a protrusion of the first insulating pillar SL1 disposed adjacent thereto. To uniformize (or create uniformity of) the thickness of a conductive pattern, the fifth opening OP5 may be formed to have the same width or substantially the same width as the first through fourth openings OP1 to OP4. The fifth opening OP5 may connect two regions of the first through third region A1 to A3 or A1' to A3', for example, the first and third regions A1 and A3 or A1' and A3'.

As illustrated in FIG. 2A, the third insulating pillars SL3 may be spaced apart from the first insulating pillar SL1. Thus, sixth and seventh openings OP6 and OP7 serving as a conductive pattern region may be formed between the third insulating pillars SL3 and the first insulating pillar SL1. To uniformize (or create uniformity of) the thickness of a conductive pattern, the sixth and seventh openings OP6 and OP7 may be formed to have the same width or substantially the same width as the first through fifth openings OP1 to OP5. The first through third regions A1 to A3 may be connected by the fifth through seventh openings OP5 to OP7. A conductive pattern formed in the conductive pattern region defined by the first through third insulating pillars SL1 to SL3 illustrated in FIG. 2A may surround the first insulating pillar SL1 and be connected in the first through third regions A1 to A3.

As illustrated in FIG. 2B, the third insulating pillars SL3 may be connected to the first insulating pillar SL1 at the memory block boundary (See FIG. 1). Due to links L1 and L2 between the third insulating pillars SL3 and the first insulating pillar SL1, one region of the first through third regions A1' to A3', for example, the second region A2', may be separated from the remaining regions, for example, the first and third regions A1' and A3'. A conductive pattern formed in the conductive pattern region defined by the first through third insulating pillars SL1 to SL3 illustrated in FIG. 2B may be separated into a first pattern formed in one region (e.g., the second region A2') of the first through third regions A1' to A3' and a second pattern connected in the remaining regions, for example, the first and third regions A1' and A3'.

Although FIGS. 1 through 2B illustrate an example in which channel pillars are disposed in three regions defined by the Y-shaped first insulating pillar SL1, the embodiments are not limited thereto. The first insulating pillar SL1 according to an embodiment may include branches radially extending from the center thereof, and have a radial cross-sectional structure, such as, for example but not limited to, a Y-shaped cross-sectional structure. In these cases, n (n is an integer equal to or larger than 2) branches may be provided, and first through n-th regions may be defined by the branches. The angles defined between each pair of branches of the first insulating pillar SL1 may be substantially the same. Channel pillars may be respectively formed in the first through n-th regions. In an embodiment, the first insulating pillar SL1 having the radial cross-sectional structure may be disposed between the second insulating pillars SL2 and between the third insulating pillars SL3 so that the widths of regions opened around the channel pillars can be uniformized (or created with uniformity). Namely, distances between the second insulating pillars SL2 and ends of the branches of the first insulating pillar SL1 and distances between the second insulating pillars SL2 and both ends of each of the third insulating pillars SL3 may be substantially the same. Thus, according to an embodiment, the widths of conductive patterns surrounding the channel pillars may be uniformized (or created with uniformity), thereby improving operating reliability of a 3D memory device.

Figure 3A:
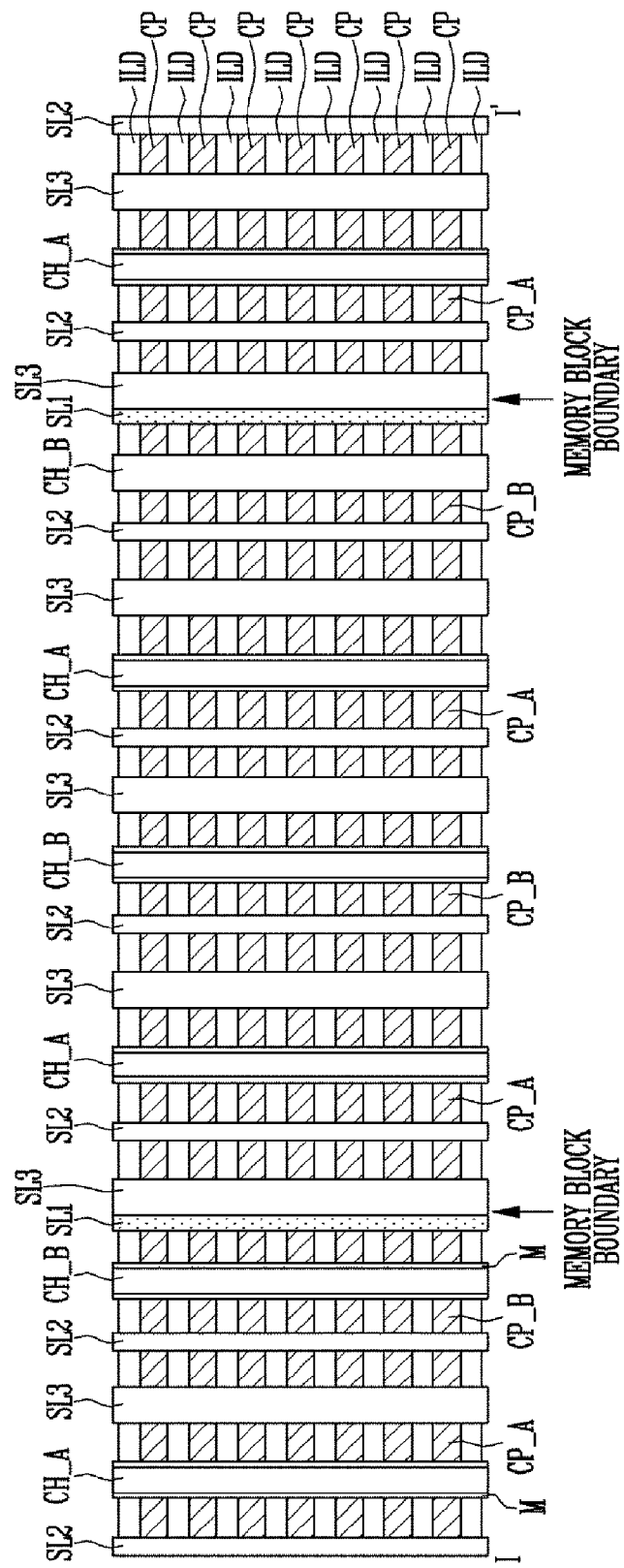
FIGS. 3A through 3C are cross-sectional view representations of a semiconductor device taken along lines I-I', II-II', and III-III' of FIG. 1.
Figure 3B:
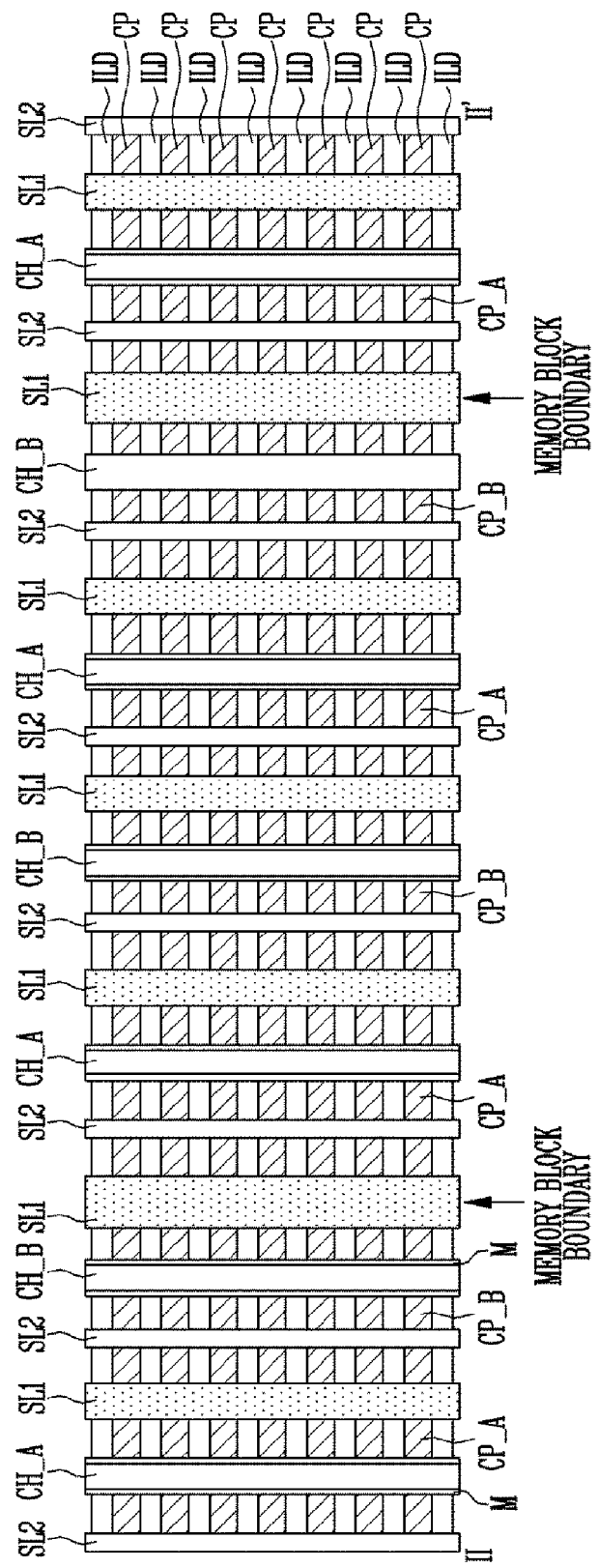
Figure 3C:
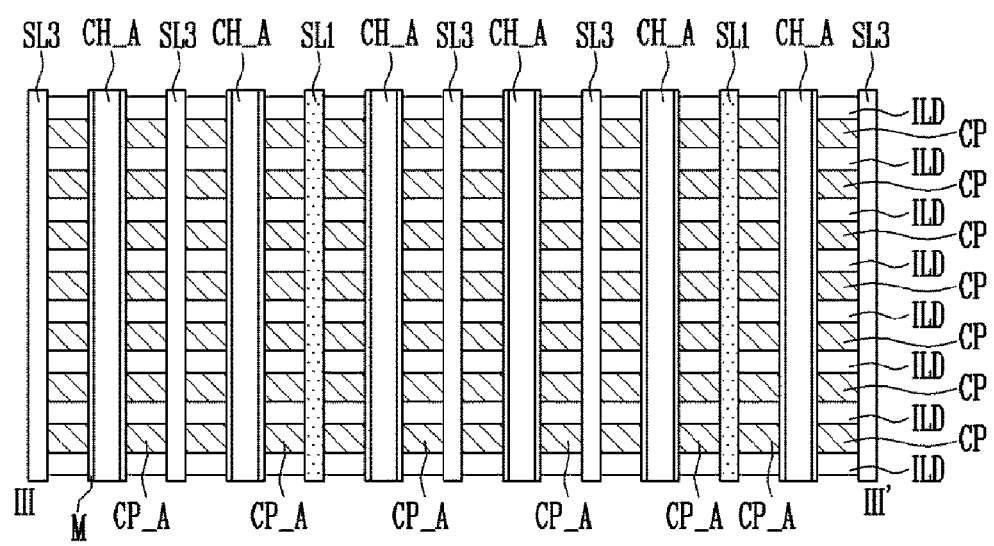

FIGS. 3A through 3C are cross-sectional views of a representation of a semiconductor device taken along lines I-I', II-II', and III-III' of FIG. 1.

Referring to FIGS. 3A through 3C, the semiconductor device according to an embodiment may include interlayer dielectric patterns ILD and conductive patterns CP alternately stacked to surround the channel pillars CH_A and CH_B. The interlayer dielectric patterns ILD and conductive patterns CP may be penetrated by the first through third insulating pillars SL1 through SL3.

The conductive patterns CP may be separated into the first conductive patterns CP_A and the second conductive patterns CP_B across the second insulating pillars SL2. Each of the first conductive patterns CP_A and the second conductive patterns CP_B may be in contact with at least one side of the first insulating pillar SL1. Each of the first conductive patterns CP_A and the second conductive patterns CP_B may be in contact with at least one side of the third insulating pillar SL3.

The multilayered layer M may be disposed between the conductive patterns CP and the channel pillars CH_A and CH_B. Thus, memory cells may be formed at intersections between the conductive patterns CP and the channel pillars CH_A and CH_B. The memory cells may be stacked along the channel pillars CH_A and CH_B and constitute a memory device having a 3D structure.

FIGS. 4A through 4D are cross-sectional views illustrating a representation of a method of manufacturing a semiconductor device according to an embodiment. In particular, FIGS. 4A through 4D are cross-sectional views taken along the line I-I' of FIG. 1.

Figure 4A:
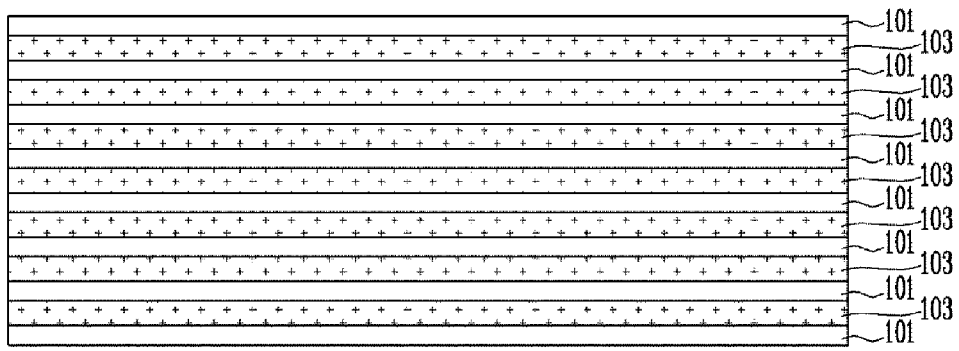
FIGS. 4A through 4D are cross-sectional view representations illustrating a method of manufacturing a semiconductor device according to an embodiment.

Referring to FIG. 4A, first material layers 101 and second material layers 103 may be alternately stacked on a previously formed underlying structure (not shown). The first material layers 101 may be formed of an insulating material for interlayer dielectric patterns. The second material layers 103 may be formed at layers where the conductive patterns will be formed. The second material layers 103 may be formed of a different material from the first material layers 101. More specifically, the second material layers 103 may be formed of a sacrificial material having an etch selectivity with respect to the first material layers 101. For example, the first material layers 101 may be formed of an oxide layer, while the second material layers 103 may be formed of a nitride layer having an etch selectivity with respect to the oxide layer.

Figure 4B:
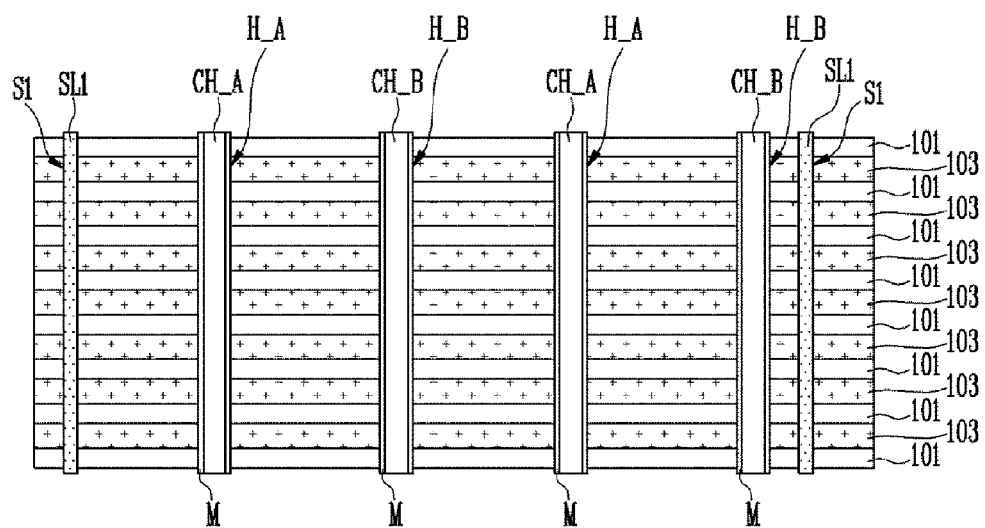

Referring to FIG. 4B, the first material layers 101 and the second material layers 103 may be etched. Through etching the first material layers 101 and the second material layers 103 first slits S1 may be formed through the first material layers 101 and the second material layers 103. Thereafter, first insulating pillars SL1 may be formed by filling the first slits S1 with an insulating material. An oxide layer may be used as the insulating material. Each of the first slits S1 and the first insulating pillars SL1 may have a Y-shaped cross-sectional structure or substantially a Y-shaped cross-sectional structure as described above with reference to FIG. 1. The first insulating pillars SL1, each of which has the Y-shaped cross-sectional structure, may define first through third regions. Alternatively, the first slits S1 and the first insulating pillars SL1 may define first through n-th regions (n is an integer equal to or larger than 2). Also, each of the first slits S1 and the first insulating pillars SL1 may have a radial cross-sectional structure having branches radially extending from a central region thereof.

The first material layers 101 and the second material layers 103 of the first through third regions defined by the respective first insulating pillars SL1 may be etched. Through etching the first material layers 101 and the second material layers 103 of the first through third regions defined by the respective first insulating pillars SL1 holes H_A and H_B may be formed through the first material layers 101 and the second material layers 103. The holes H_A and H_B may include first holes H_A and second holes H_B. During the formation of the holes H_A and H_B, the first material layers 101 and the second material layers 103 may be supported by the first insulating pillars SL1. Since the first insulating pillars SL1 have radial cross-sectional structures, such as Y-shaped cross-sectional structures, supporting abilities of the first material layers 101 and the second material layers 103 may be increased.

Thereafter, channel pillars CH_A and CH_B may be formed within the holes H_A and H_B. The channel pillars CH_A and CH_B may include first channel pillars CH_A formed within the first holes H_A and second channel pillars CH_B formed within the second holes H_B. The channel pillars CH_A and CH_B may be formed of a semiconductor material, such as, for example but not limited to, polysilicon (poly-Si). The channel pillars CH_A and CH_B may be formed as tube types along the surfaces of the holes H_A and H_B. In these cases, a central region of each of the tube-type channel pillars CH_A and CH_B may be filled with an insulating material. Alternatively, the channel pillars CH_A and CH_B may be formed as buried types by filling spaces between the surfaces of the holes H_A and H_B and central regions thereof with a semiconductor material. Alternatively, the channel pillars CH_A and CH_B may be formed by mixing tube types and buried types.

Before the channel pillars CH_A and CH_B are formed, a multilayered layer M may be further formed along the surface of each of the holes H_A and H_B. The multilayered layer M may be formed of the same material layers as described above with reference to FIG. 1.

Figure 4C:
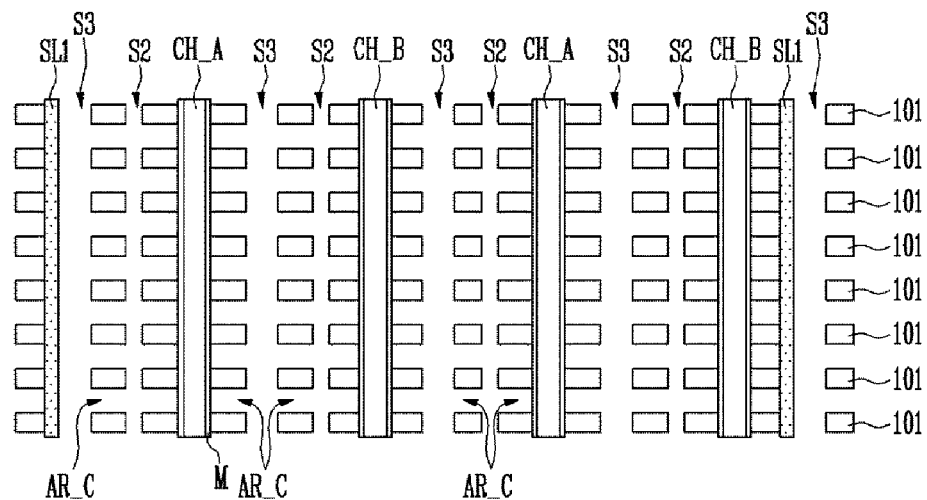

Referring to FIG. 4C, the first material layers 101 and the second material layers 103 may be etched. Through etching the first material layers 101 and the second material layers 103 second slits S2 and third slits S3 may be formed through the first material layers 101 and the second material layers 103. The second slits S2 and the third slits S3 may be separated from one another. Each of the second slits S2 may be formed between the first channel pillar CH_A and the second channel pillar CH_B disposed adjacent to each other. The third slits S3 may be formed between the second slits S2. The third slits S3 may be formed to expose one sidewall of the first insulating pillar SL1 or formed apart from the first insulating pillar SL1. During the formation of the second slits S2 and the third slits S3, first insulating pillars SL1 may support the first material layers 101 and the second material layers 103. Also, during the formation of the second slits S2 and the third slits S3, the first material layers 101 and the second material layers 103 may be supported by the channel pillars CH_A and CH_B.

Thereafter, the second material layers 103 exposed by the second slits S2 and the third slits S3 may be selectively removed to open conductive pattern regions AR_C between the first material layers 101. During the opening of the conductive pattern regions AR_C, the first insulating pillars SL1 and the channel pillars CH_A and CH_B may support the first material layers 101.

A layout of the second slits S2 may be the same as a layout of the second insulating pillars SL2 described above with reference to FIG. 1. A layout of the third slits S3 may be the same as a layout of the third insulating pillars SL3 described with reference to FIG. 1. In these cases, conductive pattern regions AR_C opened around the second slits S2 and the third slits S3 may be formed having uniform widths.

Figure 4D:
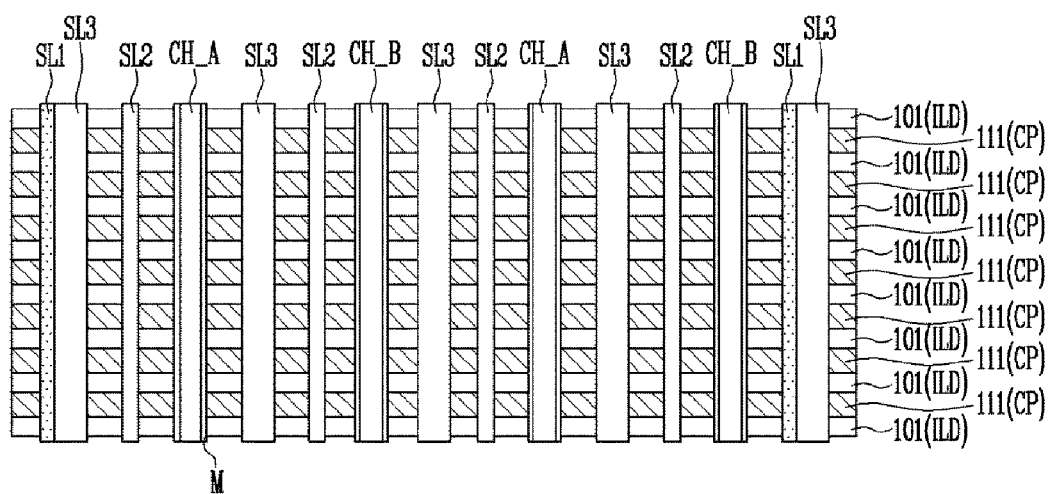

Referring to FIG. 4D, the conductive pattern regions AR_C may be filled with a conductive material 111. The conductive material 111 may include at least one of a poly-Si layer, a metal silicide layer, and a metal layer. When the conductive material 111 includes a metal layer (e.g., a tungsten (W) layer) having a lower resistance than poly-Si, the conductive material 111 may include a barrier metal formed along the surfaces of the conductive pattern regions AR_C, and the metal layer formed on the barrier metal. The barrier metal may include titanium nitride (TiN). Since the conductive pattern regions AR_C have uniform widths, the conductive material 111 may be uniformly coated within the conductive pattern regions AR_C.

Thereafter, the conductive material 111 formed outside the conductive pattern regions AR_C (i.e. within the second slits S2 and the third slits S3) may be removed to form conductive patterns CP. The conductive material 111 may remain uniformly coated within the conductive pattern regions AR_C. Thus, during an etching process for removing the conductive material 111 formed within the second slits S2 and the third slits S3, the conductive material 111 may be removed in uniform amounts around the conductive pattern regions AR_C. As a result, in an embodiment, during the etching process for removing the conductive material 111, the amount of loss of the conductive material 111 disposed within the conductive pattern regions AR_C may be minimized. Also, according to an embodiment, the conductive patterns CP may be formed to have uniform widths so that the conductive patterns CP can have uniform resistances.

Subsequently, the second slits S2 and the third slits S3 may be filled with an insulating material. An oxide layer may be used as the insulating material. Second insulating pillars 5L2 may be formed within the second slits S2, and third insulating pillars 5L3 may be formed within the third slits S3. The first material layers 101 may be separated into interlayer dielectric patterns ILD by the first through third slits S1 to S3.

As described above, in an embodiment, since a stack structure of the first material layers 101 and the second material layers 103 may be stably supported by the first insulating pillars SL1 having radial cross-sectional structures, such as Y-shaped cross-sectional structures, stability of a process of manufacturing a 3D memory device may be increased. Also, in an embodiment, the first through third insulating pillars SL1 to 5L3 may be disposed around the channel pillar CH_A or CH_B so that the conductive pattern region AR_C disposed around the channel pillar CH_A or CH_B can have a uniform width. Thus, in an embodiment, since the width of the conductive pattern CP surrounding the channel pillar CH_A or CH_B may be uniformized (or created with uniformity), operating reliability of the 3D memory device may be improved.

Figure 5A:
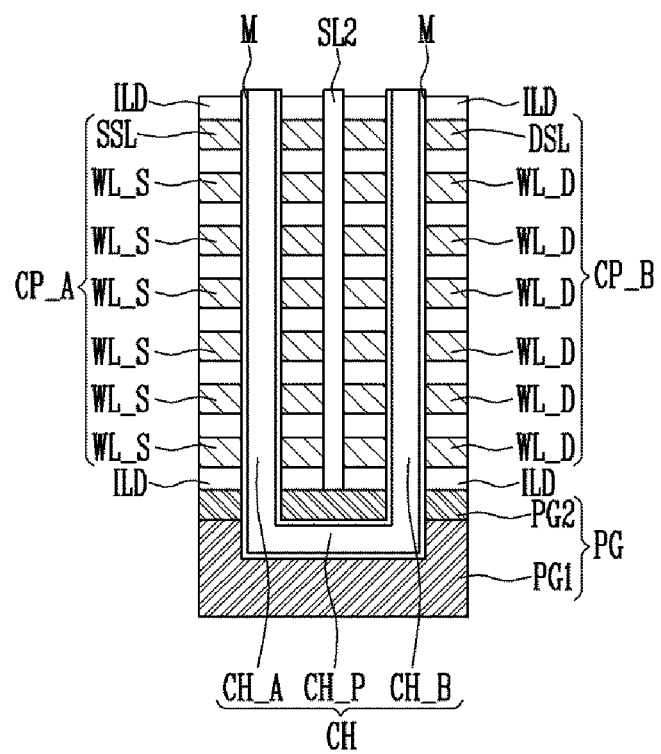

FIGS. 5A and 5B are diagrams for describing a representation of a structure of a semiconductor device according to an embodiment. FIG. 5A is a cross-sectional view of a representation of a cell string of the semiconductor device, according to an embodiment. FIG. 5B is a layout of a pipe gate PG and a pipe channel CH_P according to an embodiment.

Referring to FIG. 5A, the pipe channel CH_P and the pipe gate PG may be formed under any one of the structures described above with reference to FIGS. 1 through 4D.

The pipe channel CH_P may be connected to a pair consisting of a first channel pillar CH_A and a second channel pillar CH_B disposed adjacent to each other, from among the first channel pillars CH_A and the second channel pillars CH_B described above with reference to FIGS. 1 through 4D. The first channel pillar CH_A and the second channel pillar CH_B may be connected to both terminals of the pipe channel CH_P. Both terminals of the pipe channel CH_P may have the same or substantially the same cross-sectional structures as the first channel pillar CH_A and the second channel pillar CH_B. The first channel pillar CH_A and the second channel pillar CH_B connected to the pipe channel CH_P may be adjacent to each other across the second insulating pillar SL2.

The pipe gate PG may be formed to surround the pipe channel CH_P. The pipe gate PG may include a first pipe gate PG1 surrounding sidewalls and a bottom surface of the pipe channel CH_P and a second pipe gate PG2 stacked on the first pipe gate PG1.

The stack structure of the conductive patterns CP_A and CP_B and the interlayer dielectric patterns ILD described above with reference to FIGS. 1 through 4D may be formed on the pipe gate PG. The conductive patterns CP_A and CP_B may include the first conductive patterns CP_A and the second conductive patterns CP_B, which are separated from each other by the second insulating pillar SL2. In an embodiment, the first conductive patterns CP_A may be defined as source-side conductive patterns WL_A and SSL, while the second conductive patterns CP_B may be defined as drain-side conductive patterns WL_B and DSL. The source-side conductive patterns WL_S and SSL may include source-side word lines WL_S stacked on the pipe gate PG, and a source selection line SSL stacked in at least one layer on the source-side word lines WL_S. The drain-side conductive patterns WL_D and DSL may include drain-side word lines WL_D stacked on the pipe gate PG, and a drain selection line DSL stacked in at least one layer on the drain-side word lines WL_D.

Although not illustrated, a common source line (not shown) may be connected to the first channel pillar CH_A connected to the pipe channel CH_P, and a bit line (not shown) may be connected to the second channel pillar CH_B connected to the pipe channel CH_P.

In the above-described structure, the cell string according to the present embodiment may be formed along a U-shaped channel layer CH including the pipe channel CH_P, the first channel pillar CH_A, and the second channel pillar CH_B. An outer wall of the U-shaped channel layer CH may be surrounded by the multilayered layer M. The cell string according to an embodiment may include a source selection transistor, source-side memory cells, a pipe transistor, drain-side memory cells, and a drain selection transistor, which may be connected in series along the U-shaped channel layer CH. At an intersection between the first channel pillar CH_A and the source selection line SSL, the source selection transistor may be formed. At intersections between the first channel pillar CH_A and the source-side word lines WL_S, the source-side memory cells may be formed. The pipe transistor may be formed at an intersection between the pipe gate PG and the pipe channel CH_P. At intersections between the second channel pillar CH_B and the drain-side word lines WL_D, the drain-side memory cells may be formed. At an intersection between the second channel pillar CH_B and the drain selection line DSL, the drain selection transistor may be formed.

Referring to FIG. 5B, a plurality of pipe channels CH_P may be buried in the pipe gate PG.

A layout of the pipe channels CH_P may depend on a layout of the first channel pillars CH_A and the second channel pillars CH_B described above with reference to FIG. 1. As illustrated in FIG. 1, a pair of first channel pillar CH_A and second channel pillar CH_B disposed adjacent to each other across the second insulating pillar SL2 may be disposed substantially diagonally to the row direction and the column direction. Thus, the pipe channels CH_P, each of which may connect the corresponding one pair of the first channel pillar CH_A and the second channel pillar CH_B, may be disposed substantially diagonally to the row direction and the column direction.

Both terminals of each of the pipe channels CH_P may be formed to have a larger area than a central portion thereof so that each of the pipe channels CH_P may have a substantially dumbbell-shaped cross-sectional structure or dumbbell-shaped cross-sectional structure. The first channel pillar CH_A and the second channel pillar CH_B may be respectively connected to the both terminals of each of the pipe channels CH_P, which may have relatively large areas. The both terminals of the pipe channels CH_P may have the same or substantially the same cross-sectional structures as the first channel pillar CH_A and the second channel pillar CH_B.

The pipe gate PG may surround the pipe channels CH_P. Since each of the pipe channels CH_P has a dumbbell-shaped cross-sectional structure, areas of the pipe channels CH_P surrounded by the pipe gate PG may be increased more than areas of pipe channels having rectangular cross-sections. Thus, according to an embodiment, bias transfer characteristics due to the pipe gate PG may be improved.

The pipe gate PG may be penetrated by an insulating layer SL_P. The insulating layer SL_P may be formed in a memory block boundary and extend along the column direction. The insulating layer SL_P may be bent along outer circumferences of the channel pillars CH_A and CH_B. The insulating layer SL_P may be formed in a shape corresponding to a connection structure between the first and third insulating pillars SL1 and SL3 disposed along the memory block boundary as illustrated in FIG. 1.

Figure 6:
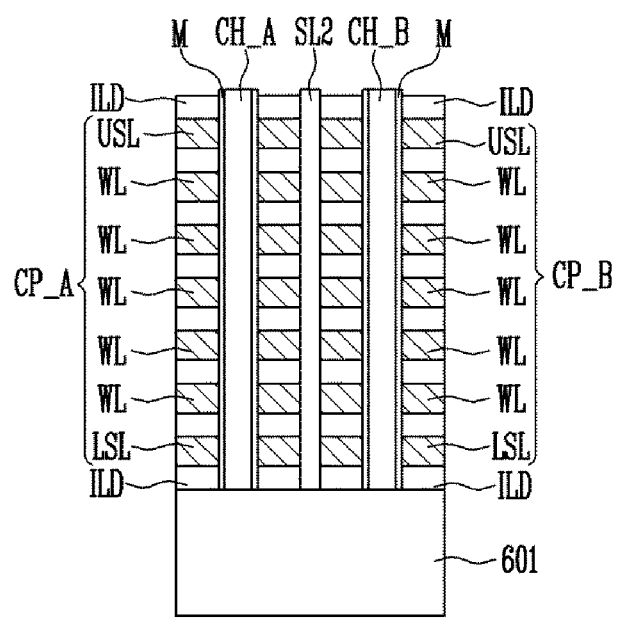
FIG. 6 is a diagram of a representation of a structure of a semiconductor device according to an embodiment.

FIG. 6 is a diagram of a representation of a structure of a semiconductor device according to an embodiment. In particular, FIG. 6 is a cross-sectional view of a representation of a cell string of the semiconductor device, according to an embodiment.

Referring to FIG. 6, a semiconductor substrate 601 including a source region may be formed under any one of the structures described above with reference to FIGS. 1 through 4D.

The source region may be an impurity implantation region formed by implanting impurities into the semiconductor substrate 601, or a doped poly-Si pattern formed on the semiconductor substrate 601. The semiconductor substrate 601 including the source region may be connected to the first channel pillar CH_A and the second channel pillar CH_B described above with reference to FIGS. 1 through 4D.

A stack structure of the conductive patterns CP_A and CP_B and the interlayer dielectric patterns ILD described above with reference to FIGS. 1 through 4D may be formed on the semiconductor substrate 601 including the source region. The conductive patterns CP_A and CP_B may include the first conductive patterns CP_A and the second conductive patterns CP_B separated from one another by the second insulating pillars SL2. A cell string connected to the first conductive patterns CP_A may be separated from a cell string connected to the second conductive pattern CP_B by the second insulating pillar SL2.

Each of the first conductive patterns CP_A and the second conductive patterns CP_B may include a lower selection line LSL formed in at least one layer, an upper selection line USL formed in at least one layer, and word lines WL stacked between the lower selection line LSL and the upper selection line USL. Although not shown, the first channel pillar CH_A and the second channel pillar CH_B may be connected to a bit line (not shown). The bit line may be disposed on the stack structure of the interlayer dielectric patterns ILD and the conductive patterns CP_A and CP_B.

In the above-described structure, each of the cell strings according to an embodiment may be formed along a straight-type channel pillar CH_A or CH_B. An outer wall of the channel pillar CH_A or CH_B may be surrounded by the multilayered layer M. Each of the cell strings according to an embodiment may include a lower selection transistor, memory cells, and an upper selection transistor, which may be connected in series along the straight-type channel pillar CH_A or CH_B. At an intersection between the channel pillar CH_A or CH_B and the lower selection line LSL, the lower selection transistor may be formed. At intersections between the channel pillar CH_A or CH_B and the word lines WL, the memory cells may be formed. At an intersection between the channel pillar CH_A or CH_B and the upper selection line USL, the upper selection transistor may be formed.

According to the above-described embodiments, the first through third insulating pillars may be disposed so as to uniformize (or create uniformity with) the width of the region opened around the channel pillar. Thus, operating reliability of the 3D memory device may be improved.

According to the above-described embodiments, since the first insulating pillar has a radial structure, such as a Y-shaped structure, stability of a process of manufacturing the 3D memory device may be improved.

Figure 7:
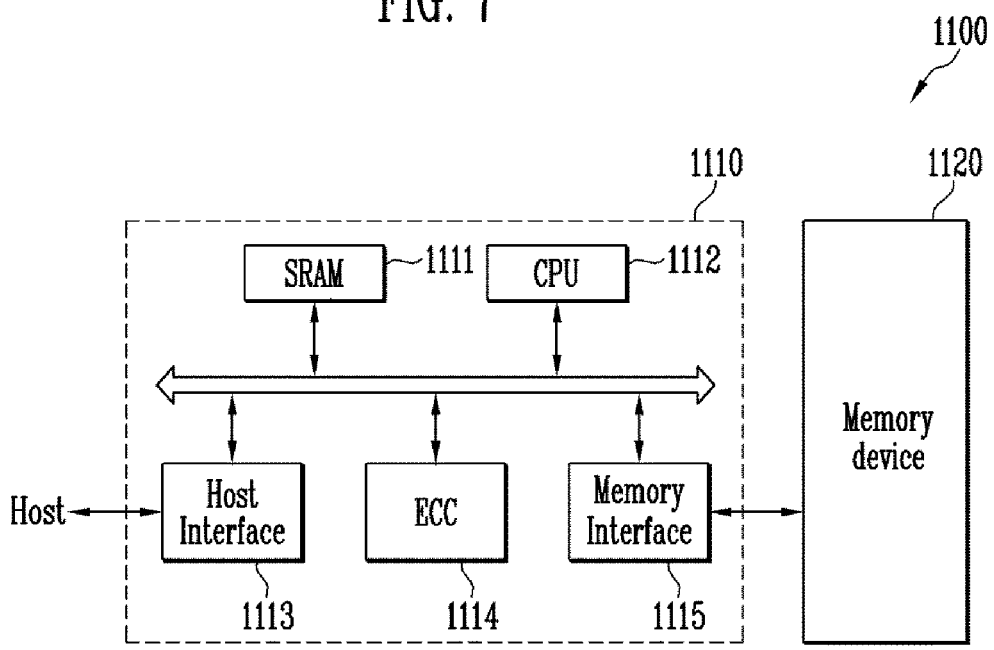
FIG. 7 is a construction diagram of a representation of a memory system according to an embodiment.

FIG. 7 is a construction diagram of a representation of a memory system 1100 according to an embodiment.

Referring to FIG. 7, the memory system 1100 according to an embodiment may include a memory device 1120 and a memory controller 1110.

The memory device 1120 may have one or more of the structures described in the previous embodiments with reference to FIGS. 1 through 6. Also, the memory device 1120 may be a multi-chip package including a plurality of flash memory chips.

The memory controller 1110 may be configured to control the memory device 1120 and include a static random access memory (SRAM) 1111, a central processing unit (CPU) 1112, a host interface 1113, an error correction code (ECC) unit 1114, and a memory interface 1115. The SRAM 1111 may be used as an operation memory of the CPU 1112. The CPU 1112 may perform general control operations for exchanging data of the memory controller 1110. The host interface 1113 may include a data exchange protocol of a host connected to the memory system 1100. Also, the ECC unit 1114 may detect and correct errors in data read from the memory device 1120, and the memory interface 1115 may interface with the memory device 1120. In addition, the memory controller 1110 may further include a read-only memory (ROM) configured to store code data for interfacing with the host.

The memory system 1100 having the above-described construction may be a memory card or a solid-state disk (SSD) in which the memory device 1120 combines with the memory controller 1110. For example, when the memory system 1100 is an SSD, the memory controller 1110 may communicate with the outside (e.g., the host) through one of various interface protocols, such as a universal serial bus (USB), a multimedia card (MMC), peripheral component interface-express (PCI-E), serial advanced technology attachment (SATA), parallel-ATA (PATA), a small computer system interface (SCSI), an enhanced small device interface (ESDI), and an intelligent drive electronics (IDE).

Figure 8:
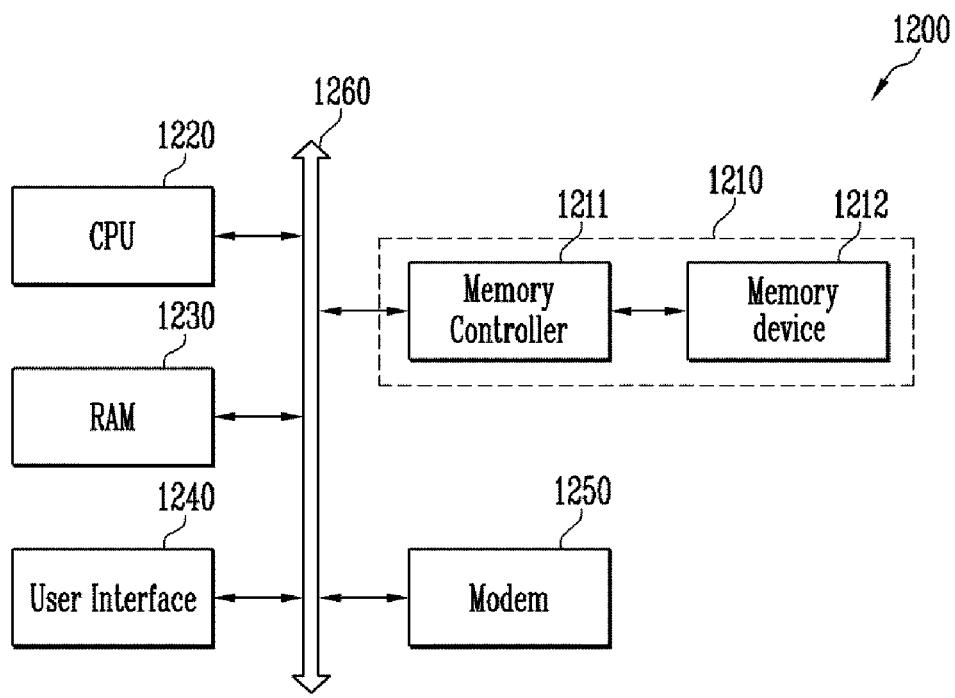
FIG. 8 is a construction diagram of a representation of a computing system according to an embodiment.

FIG. 8 is a construction diagram of a representation of a computing system 1200 according to an embodiment.

Referring to FIG. 8, the computing system 1200 according to an embodiment may include a CPU 1220, a RAM 1230, a user interface 1240, a modem 1250, and a memory system 1210, which may be electrically coupled to a system bus 1260. Also, when the computing system 1200 is a mobile device, the computing system 1200 may further include a battery for supplying an operating voltage to the computing system 1200 and also, further include an application chipset, a camera image processor (CIS), and a mobile dynamic RAM (DRAM).

As described above with reference to FIG. 7, the memory system 1210 may include a memory device 1212 and a memory controller 1211.

Accordingly, an insulating pillar defining a region where channel pillars will be disposed may be formed to have a radial cross-sectional structure, such as a Y-shaped cross-sectional structure. Thus, widths of regions opened around the channel pillars can be uniformized (or created with uniformity). As a result, operating reliability of a 3D memory device may be improved.

Accordingly, the insulating pillar may be radially formed to enhance stability in a process of manufacturing the 3D memory device.

In the drawings and specification, there have been disclosed examples of embodiments and, although specific terms are employed, they are used in a generic and descriptive sense only and not for purposes of limitation. As for the scope of the claims, it is to be set forth in the following claims. Therefore, it will be understood by those of ordinary skill in the art that various changes in form and details may be made therein without departing from the spirit and scope of the embodiments.

What is claimed is:
1. A semiconductor device comprising:
a first insulating pillar having a substantially Y-shaped cross-sectional structure to define first through third regions;
channel pillars formed in the first through third regions, respectively;
second insulating pillars disposed opposite one another across the first through third regions; and
third insulating pillars disposed between the second insulating pillars and disposed opposite one another across the first through third regions, the third insulating pillars extending in a direction intersecting the second insulating pillars.

2. The device of claim 1, wherein each of the first through third insulating pillars is bent along outer circumferences of the channel pillars.

3. The device of claim 1, wherein the second insulating pillars are spaced apart from the first insulating pillar and the third insulating pillars such that conductive pattern regions are defined between the second insulating pillars and the first insulating pillar and between the second insulating pillars and the third insulating pillars.

4. The device of claim 1, wherein the first insulating pillar is spaced apart from the second insulating pillars and the third insulating pillars such that the first through third regions are connected.

5. The device of claim 1, wherein the first insulating pillar is connected to the third insulating pillars such that one of the first through third regions is separated from the remaining regions.

6. The device of claim 1, further comprising conductive patterns and interlayer dielectric patterns alternately stacked along the channel pillars to surround the channel pillars.

7. The device of claim 6, wherein each of the conductive patterns surrounds the channel pillars and the first insulating pillar and is connected in the first through third regions.

8. The device of claim 6, wherein each of the conductive patterns comprises a first pattern formed in one of the first through third regions and a second pattern formed in the remaining regions and separated from the first pattern.

9. The device of claim 6, further comprising a multilayered layer formed between the conductive patterns and the channel pillars,
wherein the multilayered layers include at least one of a tunnel insulating layer, a data storage layer, and a blocking insulating layer,
wherein the tunnel insulating layer is in contact with the channel pillar, the data storage layer is in contact with the tunnel insulating layer, and the blocking insulating layer is in contact with the data storage layer.

10. The device of claim 6, wherein the conductive patterns comprise:
a lower selection line;
an upper selection line disposed on the lower selection line; and
word lines disposed between the lower selection line and the upper selection line.

11. A semiconductor device comprising:
first insulating pillars substantially arranged as a matrix in a row direction and a column direction, each first insulating pillar having a substantially Y-shaped cross-sectional structure;
second insulating pillars disposed across each column of the first insulating pillars, the second insulating pillars extending along the column direction;
third insulating pillars extending along the row direction between the second insulating pillars, the third insulating pillars disposed across any one of the first insulating pillars;
channel pillars formed in regions defined by the first through third insulating pillars; and
pipe channels, each pipe channel configured to connect a pair of adjacent channel pillars across any one of the second insulating pillars.

12. The device of claim 11, wherein each of the pipe channels has a substantially dumbbell-shaped cross-sectional structure.

13. The device of claim 11, wherein each of the first through third insulating pillars is bent along outer circumferences of the channel pillars.

14. The device of claim 11, further comprising a pipe gate formed to surround the pipe channels.

15. The device of claim 14, further comprising insulating layers penetrating the pipe gate and extending along the column direction, the insulating layers bent along outer circumferences of the channel pillars.

16. The device of claim 11, further comprising conductive patterns and interlayer dielectric patterns alternately stacked along the channel pillars to surround the channel pillars.

17. The device of claim 16, wherein each of the conductive patterns comprises a source-side conductive pattern and a drain-side conductive pattern separated from each other by the second insulating pillars.

18. A semiconductor device comprising:
a first insulating pillar having n branches radially extending from the center thereof, the first insulating pillar defining first through n-th regions divided from one another by the n branches, wherein n is an integer equal to or larger than 2;
channel pillars formed in the first through n-th regions, respectively;
second insulating pillars disposed opposite each other across the first through n-th regions, the second insulating pillars extending in a first direction; and
third insulating pillars disposed between the second insulating pillars, the third insulating pillars extending in a second direction intersecting the first direction.

19. The semiconductor device of claim 18, wherein the angles defined between each pair of branches of the first insulating pillar are substantially the same.

20. The semiconductor device of claim 18,
wherein distances between the second insulating pillars and ends of the branches of the first insulating pillar and distances between the second insulating pillars and both ends of each of the third insulating pillars are substantially the same.

* * * * *